(12) United States Patent
Markle et al.

(10) Patent No.: US 6,907,369 B1
(45) Date of Patent: Jun. 14, 2005

(54) METHOD AND APPARATUS FOR MODIFYING DESIGN CONSTRAINTS BASED ON OBSERVED PERFORMANCE

(75) Inventors: Richard J. Markle, Austin, TX (US); Robert J. Chong, Austin, TX (US); Alexander J. Pasadyn, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 13 days.

(21) Appl. No.: 10/425,227

(22) Filed: May 2, 2003

(51) Int. Cl.⁷ .............................................. G06F 19/00
(52) U.S. Cl. .......................................... 702/81; 702/182
(58) Field of Search ................... 156/345.13, 345.15, 156/345.24; 435/3, 4; 436/43; 438/14; 700/1, 28, 50, 51; 702/19, 22, 81, 182, 1, 33, 35, 127

(56) References Cited

U.S. PATENT DOCUMENTS

| | | | | |
|---|---|---|---|---|
| 5,754,738 A | * | 5/1998 | Saucedo et al. ............... | 706/11 |
| 6,243,614 B1 | * | 6/2001 | Anderson .................... | 700/108 |
| 6,365,422 B1 | * | 4/2002 | Hewett et al. ................. | 438/14 |
| 6,408,220 B1 | * | 6/2002 | Nulman ....................... | 700/121 |
| 6,442,496 B1 | * | 8/2002 | Pasadyn et al. ................ | 702/83 |
| 6,645,780 B1 | * | 11/2003 | Sonderman et al. ............ | 438/14 |
| 6,650,955 B1 | * | 11/2003 | Sonderman et al. ......... | 700/108 |
| 6,665,623 B1 | * | 12/2003 | Pasadyn et al. ................ | 702/84 |
| 6,675,058 B1 | * | 1/2004 | Pasadyn et al. .............. | 700/121 |
| 6,678,570 B1 | * | 1/2004 | Pasadyn et al. ............. | 700/109 |
| 6,698,009 B1 | * | 2/2004 | Pasadyn et al. ................ | 716/19 |
| 6,701,206 B1 | * | 3/2004 | Markle et al. ............... | 700/121 |
| 6,708,075 B2 | * | 3/2004 | Sonderman et al. ......... | 700/121 |
| 6,708,129 B1 | * | 3/2004 | Pasadyn et al. ................ | 702/81 |
| 6,725,121 B1 | * | 4/2004 | Pasadyn et al. ............. | 700/121 |
| 6,732,007 B1 | * | 5/2004 | Pasadyn et al. ............. | 700/121 |
| 6,746,882 B1 | * | 6/2004 | Stirton et al. ................. | 438/14 |
| 6,751,518 B1 | * | 6/2004 | Sonderman et al. ......... | 700/121 |
| 6,756,243 B2 | * | 6/2004 | Pasadyn et al. ............... | 438/14 |
| 6,757,579 B1 | * | 6/2004 | Pasadyn ..................... | 700/108 |
| 2003/0212523 A1 | * | 11/2003 | Dorough et al. ............ | 702/119 |

OTHER PUBLICATIONS

Chen, S;"AEMPES: An Expert System for In–Situ Diagnostics and Process Monitoring";IEEE International Semiconductor Manufacturing Science Symposium; May 21–23, 1990; pp 119–122.*

Nurani, R; Shanthikumar, J; "The Impact of Lot–to–Lot and Wafer–to–Wafer Variations on SPC"; IEEE International Semiconductor Manufacturing Science Symposium; Oct. 6–8, 1997; pp 69–72.*

(Continued)

Primary Examiner—John Barlow
Assistant Examiner—Douglas N Washburn
(74) Attorney, Agent, or Firm—Williams, Morgan & Amerson

(57) ABSTRACT

A method for modifying design constraints based on observed performance includes measuring a characteristic of a plurality of devices manufactured in a process flow. A design constraint associated with the characteristic is defined. A performance metric relating the performance of the devices as a function of the measured characteristic and the design constraint is generated. The design constraint is modified based on the performance metric. A manufacturing system includes a metrology tool and a design rule monitor. The metrology tool is configured to measure a characteristic of a plurality of devices manufactured in a process flow. The design rule monitor is configured to receive a design constraint associated with the characteristic, generate a performance metric relating the performance of the devices as a function of the measured characteristic and the design constraint, and modify the design constraint based on the performance metric.

29 Claims, 4 Drawing Sheets

OTHER PUBLICATIONS

Karr, C; "Adaptive Process Control Using Biologic Paradims"; Proceedings Electronic Technology Directions to the Year 2000; 1995; pp 128–136.*

Karr, C; Sharma, S; "An Adaptive Process Control System Based on Fuzzy Logic and Genetic Algorithms"; American Control Conference; vol. 3; Jun. 29–Jul. 1, 1994; pp 2470–2474.*

Lensing, K; Markle, R, Stirton, B; Laughery, M; "Shallow Trench Isolation Scatterometry Metrology in a High Volume Fab"; IEEE International Semiconductor Manufacturing Symposium; Oct. 8–10, 2001; pp 195–198.*

Bucheim, R; "Developing Performance Metrics for a Design Engineering Department"; IEEE Transaction on Engineering Management; vol. 47, issue 3; Aug. 2000; pp 309–320.*

* cited by examiner

METHOD AND APPARATUS FOR MODIFYING DESIGN CONSTRAINTS BASED ON OBSERVED PERFORMANCE

BACKGROUND OF THE INVENTION

1. Field of the Invention

This invention relates generally to an industrial process, and, more particularly, to a method and apparatus for modifying design constraints based on observed performance in a semiconductor device manufacturing environment.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a wafer using a variety of processing tools, including photolithography steppers, etch tools, deposition tools, polishing tools, rapid thermal processing tools, implantation tools, etc. One technique for improving the operation of a semiconductor processing line includes using a factory wide control system to automatically control the operation of the various processing tools. The manufacturing tools communicate with a manufacturing framework or a network of processing modules. Each manufacturing tool is generally connected to an equipment interface. The equipment interface is connected to a machine interface which facilitates communications between the manufacturing tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices. Pre-processing and/or post-processing metrology data is supplied to process controllers for the tools. Operating recipe parameters are calculated by the process controllers based on the performance model and the metrology information to attempt to satisfy the control objective (e.g., achieve post-processing results as close to a process target value as possible). Reducing variation in this manner leads to increased throughput, reduced cost, higher device performance, etc., all of which equate to increased profitability.

Typically, during the design of the semiconductor device, ranges of acceptable values for the various features on the device are determined (e.g., using a computer modeling tool). These ranges are commonly referred to as design constraints or design rules. For example, a design constraint may be imposed on a gate electrode width, a spacer width, or a process layer thickness in a device incorporating transistors. Once the device is designed, the design constraints are typically fixed.

Process control is becoming increasingly important in the semiconductor industry as production specifications are becoming less tolerant to variance in product quality. Historically, semiconductor process control has consisted of independent unit operation run-to-run controllers where the process targets are determined by individual operation models and do not consider the process as a whole. Run-to-run controllers have been employed to control these independent unit operations, such as chemical mechanical planarization, chemical vapor deposition, rapid thermal annealing, plasma etching, etc., and the run-to-run control algorithms, which are designed to maintain the unit operations at the desired process targets, are well understood. A run-to-run controller typically focuses on only one process and its associated process target value. Each run-to-run controller attempts to achieve its process target value within an acceptable range of variation. The process target value is typically set somewhere along range of acceptable values (e.g., between upper and lower design constraints) for the characteristic controlled. However, there are typically numerous process steps that affect the outcome of a particular performance characteristic of the completed device. Because each individual process has its own process target value and controller attempting to reach that process target value, it is difficult to control the performance characteristic. Typically, multiple levels of conservatism (i.e., for each device characteristic that contributes to the performance of the device) are employed to provide assurance that the completed device will have acceptable performance.

In some cases, electrical measurements that determine the performance of the fabricated devices are not conducted until relatively late in the fabrication process, and sometimes not until the final test stage. This lag between the fabrication of the devices and the measurement of their performance characteristics makes it difficult to automatically control the fabrication processes to achieve the performance goals.

Typically, the performance characteristics (e.g., speed, contact resistance, power consumption, read/write/erase cycles, etc.) of the devices manufactured are indirectly controlled by controlling the physical characteristics of the devices based on the design values determined for the dimensions and materials for the features. Variations in the actual device characteristics from the process target values cause corresponding variation in the performance characteristics. In some cases, a plurality of sources of variation may combine in an additive fashion to cause the electrical performance characteristics of the completed devices to be degraded or entirely unacceptable.

Typically, there may be more than one set of design or process target values that can be used to achieve a particular performance characteristic goal. However, because an indirect method of controlling the electrical performance characteristics is employed, the process target values are typically static and are dictated by the predetermined design constraints.

The present invention is directed to overcoming, or at least reducing the effects of, one or more of the problems set forth above.

SUMMARY OF THE INVENTION

One aspect of the present invention is seen in a method for modifying design constraints based on observed performance. The method includes measuring a characteristic of a plurality of devices manufactured in a process flow. A design constraint associated with the characteristic is defined. A performance metric relating the performance of the devices as a function of the measured characteristic and the design constraint is generated. The design constraint is modified based on the performance metric.

Another aspect of the present invention is seen in a manufacturing system including a metrology tool and a design rule monitor. The metrology tool is configured to measure a characteristic of a plurality of devices manufactured in a process flow. The design rule monitor is configured to receive a design constraint associated with the characteristic, generate a performance metric relating the performance of the devices as a function of the measured characteristic and the design constraint, and modify the design constraint based on the performance metric.

BRIEF DESCRIPTION OF THE DRAWINGS

The invention may be understood by reference to the following description taken in conjunction with the accompanying drawings, in which like reference numerals identify like elements, and in which.

Figure 1:
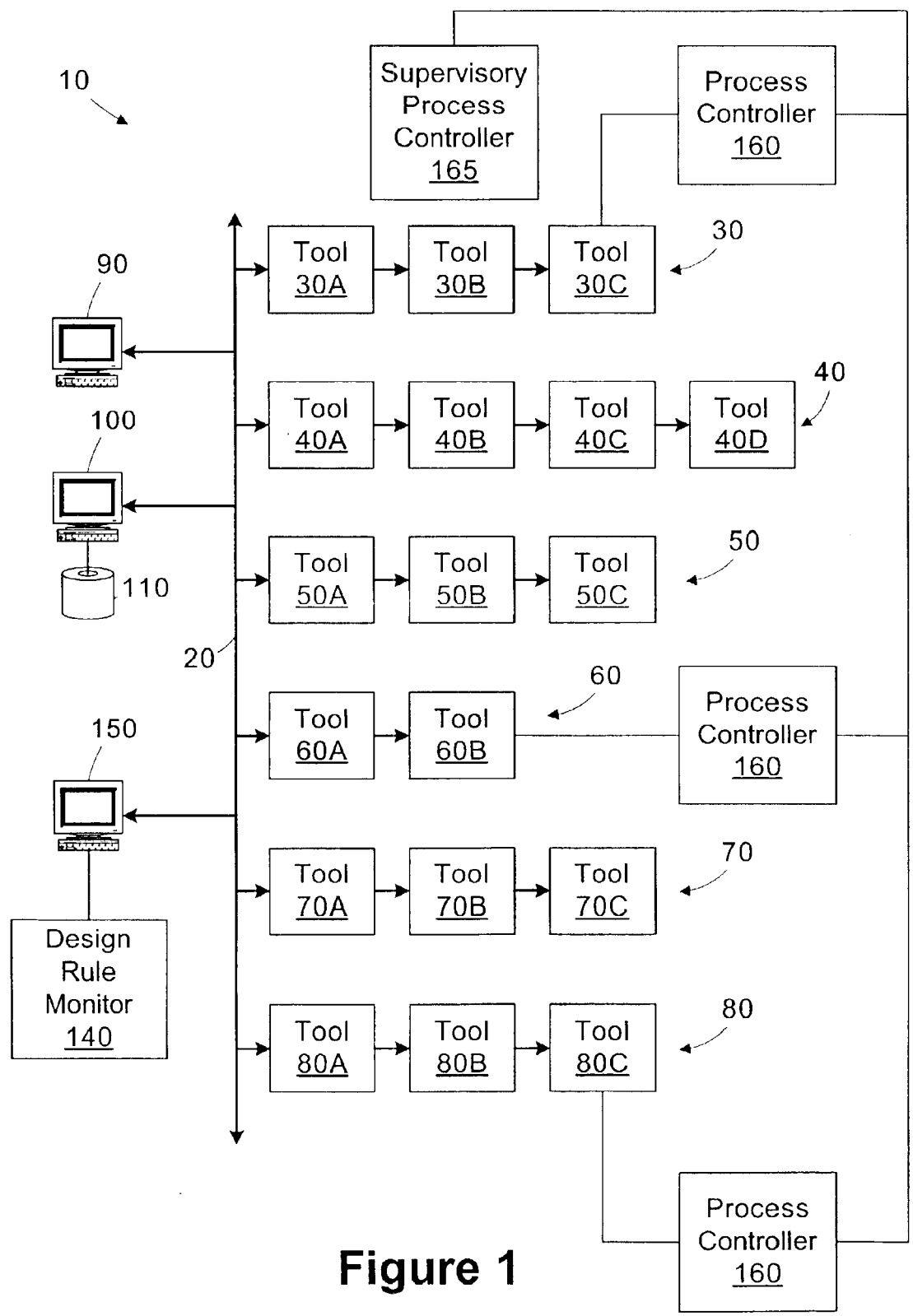
FIG. 1 is a simplified block diagram of a manufacturing system in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of an illustrative manufacturing system 10 is provided. In the illustrated embodiment, the manufacturing system 10 is adapted to fabricate semiconductor devices. Although the invention is described as it may be implemented in a semiconductor fabrication facility, the invention is not so limited and may be applied to other manufacturing environments. The techniques described herein may be applied to a variety of workpieces or manufactured items, including, but not limited to, microprocessors, memory devices, digital signal processors, application specific integrated circuits (ASICs), or other devices. The techniques may also be applied to workpieces or manufactured items other than semiconductor devices.

A network 20 interconnects various components of the manufacturing system 10, allowing them to exchange information. The illustrative manufacturing system 10 includes a plurality of tools 30–80. Each of the tools 30–80 may be coupled to a computer (not shown) for interfacing with the network 20. The tools 30–80 are grouped into sets of like tools, as denoted by lettered suffixes. For example, the set of tools 30A–30C represent tools of a certain type, such as a chemical mechanical planarization tool. A particular wafer or lot of wafers progresses through the tools 30–80 as it is being manufactured, with each tool 30–80 performing a specific function in the process flow. Exemplary processing tools for a semiconductor device fabrication environment include metrology tools, photolithography steppers, etch tools, deposition tools, polishing tools, rapid thermal processing tools, implantation tools, etc. The tools 30–80 are illustrated in a rank and file grouping for illustrative purposes only. In an actual implementation, the tools 30–80 may be arranged in any physical order or grouping. Additionally, the connections between the tools in a particular grouping are meant to represent connections to the network 20, rather than interconnections between the tools 30–80.

A manufacturing execution system (MES) server 90 directs the high level operation of the manufacturing system 10. The MES server 90 monitors the status of the various entities in the manufacturing system 10 (i.e., lots, tools 30–80) and controls the flow of articles of manufacture (e.g., lots of semiconductor wafers) through the various tools. A database server 100 may be provided for storing data related to the status of the various entities and articles of manufacture in the process flow. The database server 100 may store information in one or more data stores 110. The data may include pre-process and post-process metrology data, tool states, lot priorities, etc.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The manufacturing system 10 also includes a design rule monitor 140 executing on a computer 150. The design rule monitor 140 evaluates the devices manufactured in the manufacturing system 10 with respect to their relationship to established design constraints for the design of the particular device. Hence, each different type of device would likely have its own set of design constraints.

Process controllers 160 may be associated with one or more of the process tools 30–80. The process controllers 160 determine control actions for controlling selected ones of the tools 30–80 serving as process tools based on metrology data collected during the fabrication of wafers (i.e., by others of the tools 30–80 serving as metrology tools). The particular control models used by the process controllers 160 depend on the type of tool 30–80 being controlled. The control models may be developed empirically using commonly known linear or non-linear techniques. The control models may he relatively simple equation-based models (e.g., linear, exponential, weighted average, etc.) or a more complex model, such as a neural network model, principal component analysis (PCA) model, partial least squares projection to latent structures (PLS) model. The specific implementation of the control models may vary depending on the modeling techniques selected and the process being controlled. The selection and development of the particular control models would be within the ability of one of ordinary skill in the art, and accordingly, the control models are not described in greater detail herein for clarity and to avoid obscuring the instant invention.

In some embodiments, a supervisory process controller 165 may be provided to coordinate the efforts of the individual run-to-run process controllers 160. The supervisory process controller 165 may either monitor the performance of a particular completed feature (e.g., transistor, contact, etc.) on the device and adjust the run-to-run process controllers 160 accordingly or cascade control actions for downstream/upstream controllers. Although only one level of supervisory control is illustrated, it is contemplated that multiple levels may be employed.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999 —Provisional Specification for CIM Framework Advanced Process Control Component) specifications are publicly available from SEMI, which is headquartered in Mountain View, Calif.

The processing and data storage functions are distributed amongst the different computers in FIG. 1 to provide general independence and central information storage. Of course, different numbers of computers and different arrangements may be used without departing from the spirit and scope of the instant invention.

Figure 2A:
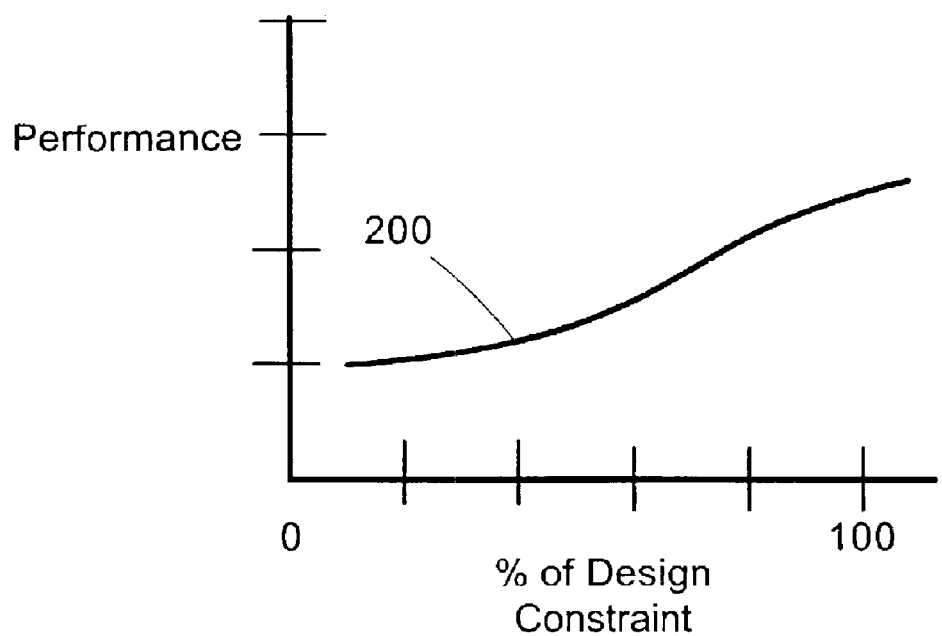
FIGS. 2A and 2B illustrate performance and yield as a function of the relationship between a measured characteristic and a design constraint.
Figure 2B:
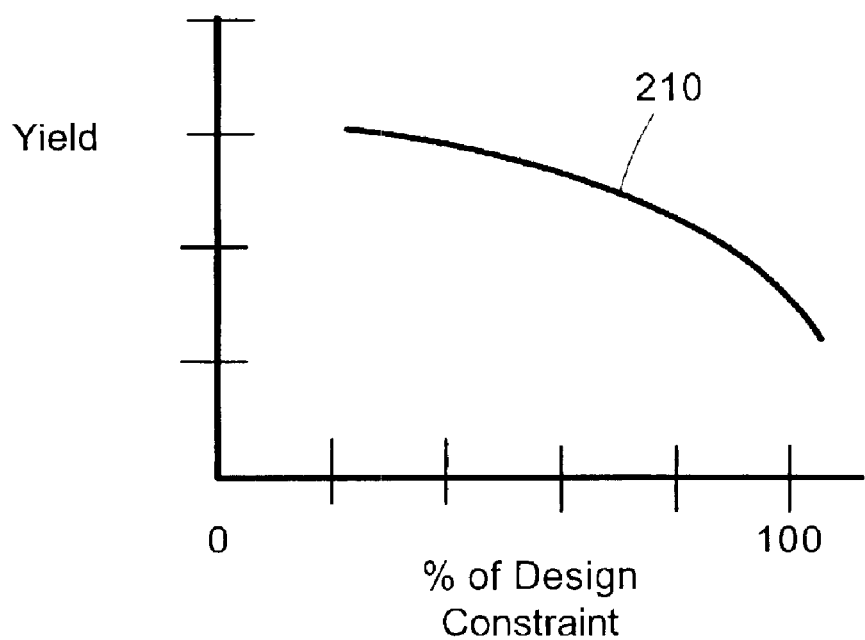

In evaluating performance as a function of design rule, the design rule monitor 140 may construct various metrics, such as performance versus percentage of design constraint. For example, switching speed or drive current of a transistor could be plotted on one axis and the relationship between the actual characteristic of the device and the design constraint for that characteristic. FIG. 2A illustrates a graph 200 of performance as a function of the relationship between a measured characteristic of a device and the design constraint for that characteristic. If the measured characteristic value was equal to the design constraint, the percentage would be 100%. Of course, other types of metrics relating the measured characteristic value to the design constraint may be defined. For example, in cases where the design constraint approaches zero, a metric other than a ratio metric may be used. In the illustrated metric, percentages over 100% indicate a situation where the measured characteristic value exceeds the design constraint. In such cases, the device may be defective, or alternatively, the device may have enhanced performance. Generally, there is a relationship between yield and performance. As the design constraints are approached, the performance of some devices that pass functional tests may be enhanced, but the yield of the wafer including the individual devices may be reduced (i.e., higher performance, but less functioning devices). FIG. 2B illustrates a graph 210 of yield as a function of the relationship between a measured characteristic of a device and the design constraint for that characteristic. As the measured characteristic approaches the design constraint, the yield typically drops off. The yield metric may be used as a limiting factor to changes to the design constraint based on the performance metric. In such cases, the design rule monitor 140 may estimate a change in yield associated with a change in the design constraint (i.e., driven by the performance metric) and reduce the size of the proposed change so as to not adversely affect yield to a point where the advantage gained in performance is outweighed by the cost associated with the reduced yield.

By evaluating the performance of the completed devices as a function of their relationship to design constraints, the design rule monitor 140 may identify cases where the design constraint is either unnecessarily conservative or overly aggressive. Based on the analysis of the design rules, the design rule monitor 140 may adjust the design rule, either for devices currently in production, or for a subsequent generation of devices. If the computer modeling of the subsequent generation specifies a particular design constraint that the design rule monitor has determined is unnecessarily conservative, it may set the design constraint at a different level to attempt to increase the performance of the devices. Similarly, if the modeled design constraint is determined to be too aggressive, the design rule monitor 140 may change the design constraint to attempt to affect yield. In general, a design constraint representing a minimum characteristic value may be made more conservative by increasing the minimum value, and a design constraint representing a maximum characteristic value may be made more conservative by decreasing the maximum value. Likewise, a design constraint representing a minimum characteristic value may be made more aggressive by decreasing the minimum value, and a design constraint representing a maximum characteristic value may be made more aggressive by increasing the maximum value.

The design rule monitor 140 may also specify a new design rule based on the observed information. During the design process design rules may not be determined for a particular characteristic of the device. For example, a target process layer thickness may be defined for the process flow, but design constraints on its value may not be predetermined. The design rule monitor 140 may track performance metrics for characteristics with no predetermined design constraints. If the design rule monitor 140 determines that variation in one of these values can indeed affect the performance of the completed device, the design rule monitor 140 may specify a new design constraint for the observed characteristic.

After determining appropriate revisions for the design rules, the design rule monitor 140, the process controllers 160, and/or the supervisory process controller 165 may change the process targets for the tools 30–80 controlled. For example, if the process target is defined by a percentage of the design constraint, the process target may be updated when the design constraint value is determined. In other cases, a change to the process target may be determined using a predictive model as opposed to a fixed linear calculation.

In another embodiment, the design rule monitor 140 assesses the performance of the individual process controllers 160 and/or supervisory process controller 165 with respect to the design constraints. One goal of the process controller 160 is to determine recipe settings for its associated tool 30–80 to reduce the deviation observed in an output characteristic of a processed wafer. The process controller 160 provides operating recipes to the tool 30–80 based on the control actions derived from its control model. In a feedback mode of operation, the process controller 160 compares an established process target against metrology data collected after completion of the processing and adjusts one or more recipe parameters to reduce the error for a subsequent processing run. For example, a process controller 160 may be provided for controlling a critical dimension (CD) of a transistor gate electrode. The design rule monitor 140 may use metrology data collected for the CD to gauge evaluate the performance of the process controller 160 with respect to the established design constraints.

Figure 3:
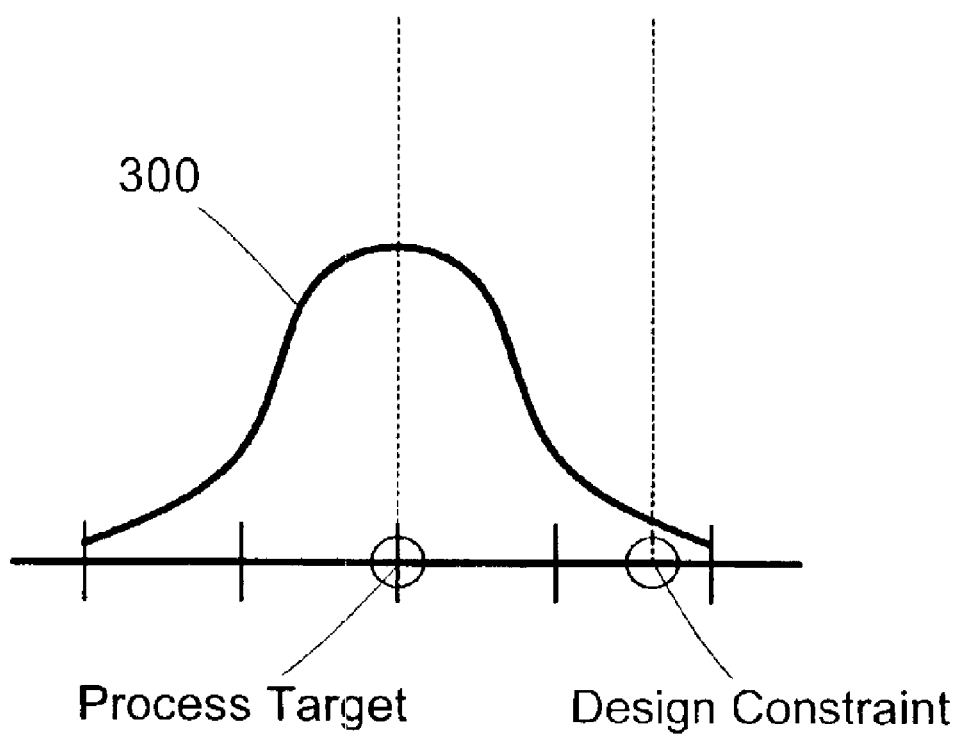
FIG. 3 is a graph illustrating the performance of a process controller with respect to design constraints.

Referring briefly to FIG. 3, a graph illustrating the performance of one of the process controllers 160, 165 with respect to the design constraints is provided. The design rule monitor 140 generates a distribution 300 representing the actual measured characteristic as a percentage of the design constraint. Presumably the mean of the distribution 300 should roughly correspond to the process target. There may be variation due to limitations of the process controller 160, 165 and tool 30–80 in achieving the process target. The limitations may include, model mismatch, process noise, measurement noise, tool health, etc.

In general, as the process target approaches the design rule, the distribution 300 should move to the right. The mean of the distribution 300 may be expressed as a percentage of the design constraint. This metric corresponds to the aggressiveness of the process controller 160, 165 in attempting to approach the design constraints. The design rule monitor 140 may determine multiple distributions 300 for different output characteristics and different process controllers 160, 165. By monitoring the results of the process controllers 160, 165, the design rule monitor 140 can determine the effects of changes to the aggressiveness of the controller 160, 165 on the performance and/or yield of the completed devices. For example, a lot or lots of wafers may be processed with more aggressive settings (i.e., by moving the process target closer to the design constraint) and the performance of the devices so processed may be evaluated by the design rule monitor 140 to determine if pushing the design constraints has achieved the production of higher performance devices.

In some embodiments, the design rule monitor 140 may choose not to implement a proposed design constraint change. In some cases, a change in one design constraint may have an impact on a different characteristic or on the control of a different process. Hence, a design constraint change may have ripple effects or may conflict with other competing interests (e.g., design constraints for other characteristics). The design rule monitor 140 may evaluate or estimate these ripple or competition effects and elect not to implement the design constraint change, thus enforcing a hard constraint.

Figure 4:
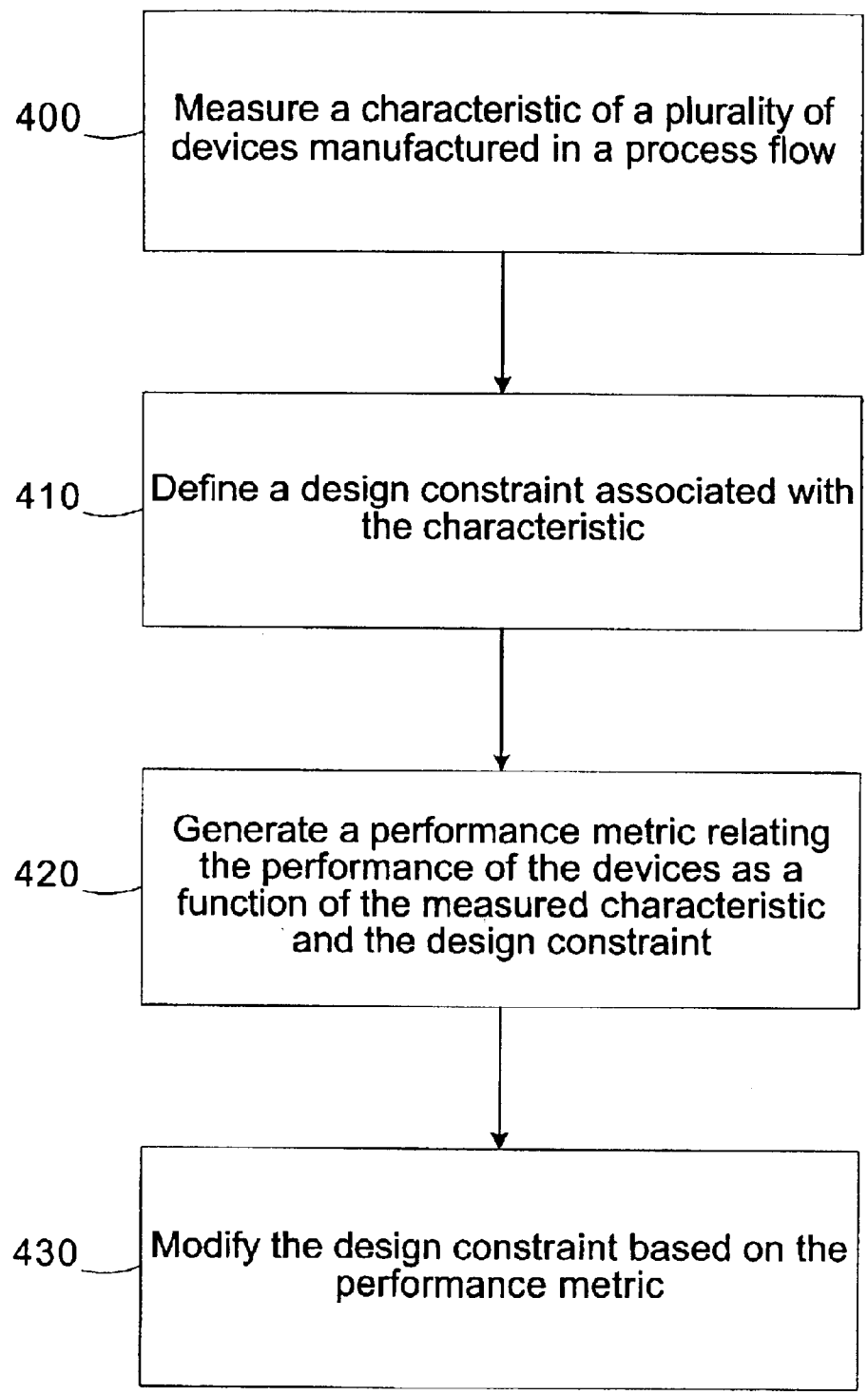
FIG. 4 is a simplified flow diagram of a method for evaluating design rules in accordance with another illustrative embodiment of the present invention.

Turning now to FIG. 4, a simplified flow diagram of a method for evaluating design rules in accordance with another illustrative embodiment of the present invention is provided. In block 400, a characteristic of a plurality of devices manufactured in a process flow is measured. In block 410, a design constraint associated with the characteristic is defined. In block 420, a performance metric relating the performance of the devices as a function of the measured characteristic and the design constraint is generated. In block 430, the design constraint is modified based on the performance metric.

By relating the performance of completed devices as a function of the design constraints, the process flow may be monitored to identify situations where the design constraints are unnecessarily conservative or overly aggressive. Such monitoring allows the automatic adjustment of the design constraints for current or subsequent product lines to enhance the effectiveness of the process control applied to the process flow. This increase in effectiveness equates generally to increased device performance, process flow stability, and reduced variation, which enhance the profitability of the manufacturing system 10 and its products.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variation are considered within the scope and spirit of the invention. Accordingly, the protection sought herein is as set forth in the claims below.

What is claimed:

1. A method, comprising:
measuring a characteristic of a plurality of devices manufactured in a process flow;
defining a design constraint associated with the characteristic;
generating a performance metric relating the performance of the devices as a function of the measured characteristic and the design constraint; and
modifying the design constraint based on the performance metric.

2. The method of claim 1, further comprising:
controlling a process in the process flow in accordance with a target value; and
generating the target value based on the modified design constraint.

3. The method of claim 1, wherein generating the performance metric further comprises determining a relationship between the measured characteristic and the design constraint.

4. The method of claim 3, wherein generating the performance metric further comprises determining a ratio between the measured characteristic and the design constraint.

5. The method of claim 1, wherein the design constrain represents a minimum value for the characteristic, and modifying the design constraint further comprises increasing the minimum value to reduce a degree of aggressiveness associated with the design constraint.

6. The method of claim 1, wherein the design constrain represents a maximum value for the characteristic, and modifying the design constraint further comprises decreasing the maximum value to reduce a degree of aggressiveness associated with the design constraint.

7. The method of claim 1, wherein the design constraint represents a minimum value for the characteristic, and modifying the design constraint further comprises decreasing the minimum value to reduce a degree of conservatism associated with the design constraint.

8. The method of claim 1, wherein the design constraint represents a maximum value for the characteristic, and modifying the design constraint further comprises increasing the maximum value to reduce a degree of conservatism associated with the design constraint.

9. The method of claim 1, further comprising determining a yield metric relating the performance of the devices as a function of the measured characteristic, wherein modifying the design constraint further comprises modifying the design constraint based on the performance metric and the yield metric.

10. The method of claim 1, further comprising:
associating devices processed in the process flow with a particular controller; and
determining a performance distribution of the controller based on the measured characteristic and the design constraint.

11. The method of claim 10, further comprising:
defining a target value for the controller; and modifying the target value based on the modified design constraint.

12. The method of claim 10, further comprising:
defining a target value for the controller; and
modifying the target value to shift the distribution toward the design constraint.

13. The method of claim 10, further comprising:
defining a target value for the controller; and
modifying the target value to shift the distribution away from the design constraint.

14. The method of claim 1, further comprising enforcing the design constraint without modification.

15. A manufacturing system, comprising:
a metrology tool configured to measure a characteristic of a plurality of devices manufactured in a process flow; and
a design rule monitor configured to receive a design constraint associated with the characteristic, generate a performance metric relating the performance of the devices as a function of the measured characteristic and the design constraint, and modify the design constraint based on the performance metric.

16. The system of claim 15, further comprising a controller configured to control a process in accordance with a target value, wherein the target value is based on the modified design constraint.

17. The system of claim 15, wherein the performance metric further comprises a relationship between the measured characteristic and the design constraint.

18. The system of claim 17, wherein the performance metric further comprises a ratio between the measured characteristic and the design constraint.

19. The system of claim 15, wherein the design constraint represents a minimum value for the characteristic, and the design rule monitor is configured to increase the minimum value to reduce a degree of aggressiveness associated with the design constraint.

20. The system of claim 15, wherein the design constraint represents a maximum value for the characteristic, and the design rule monitor is configured to decrease the maximum value to reduce a degree of aggressiveness associated with the design constraint.

21. The system of claim 15, wherein the design constraint represents a minimum value for the characteristic, and the design rule monitor is configured to decrease the minimum value to reduce a degree of conservatism associated with the design constraint.

22. The system of claim 15, wherein the design constraint represents a maximum value for the characteristic, and the design rule monitor is configured to increase the maximum value to reduce a degree of conservatism associated with the design constraint.

23. The system of claim 15, wherein the design rule monitor is configured to determine a yield metric relating the performance of the devices as a function of the measured characteristic and modify the design constraint based on the performance metric and the yield metric.

24. The system of claim 15, wherein the design rule monitor is configured to associate devices processed in the process flow with a particular controller and determine a performance distribution of the controller based on the measured characteristic and the design constraint.

25. The system of claim 24, wherein a target value is associated with the controller, and the target value is based on the modified design constraint.

26. The system of claim 24, wherein a target value is associated with the controller, and at least one of the design rule monitor and the controller is configured to modify the target value to shift the distribution toward the design constraint.

27. The system of claim 24, wherein a target value is associated with the controller, and at least one of the design rule monitor and the controller is configured to modify the target value to shift the distribution away from the design constraint.

28. The method of claim 15, wherein the design rule monitor further is further configured to enforce the design constraint without modification.

29. A system, comprising:
means for measuring a characteristic of a plurality of devices manufactured in a process flow;
means for defining a design constraint associated with the characteristic;
means for generating a performance metric relating the performance of the devices as a function of the measured characteristic and the design constraint; and
means for modifying the design constraint based on the performance metric.

* * * * *